United States Patent
Kuroda et al.

(10) Patent No.: US 10,895,605 B2
(45) Date of Patent: Jan. 19, 2021

(54) LIFE ESTIMATION APPARATUS FOR LITHIUM ION SECONDARY CELL

(71) Applicant: Panasonic Intellectual Property Management Co., Ltd., Osaka (JP)

(72) Inventors: Yuta Kuroda, Osaka (JP); Masanobu Takeuchi, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 275 days.

(21) Appl. No.: 16/141,118

(22) Filed: Sep. 25, 2018

(65) Prior Publication Data

US 2019/0025381 A1    Jan. 24, 2019

Related U.S. Application Data

(63) Continuation of application No. PCT/JP2017/003773, filed on Feb. 2, 2017.

(30) Foreign Application Priority Data

Mar. 31, 2016    (JP) ................................ 2016-072039

(51) Int. Cl.
*G01R 31/392* (2019.01)
*H01M 10/48* (2006.01)
(Continued)

(52) U.S. Cl.
CPC ....... *G01R 31/392* (2019.01); *G01R 31/3648* (2013.01); *G01R 31/3842* (2019.01);
(Continued)

(58) Field of Classification Search
None
See application file for complete search history.

(56) References Cited

U.S. PATENT DOCUMENTS

| 2010/0079127 A1* | 4/2010 | Grant | H05B 45/37 323/285 |
| 2014/0042968 A1* | 2/2014 | Hiroe | H02J 7/007194 320/109 |
| 2016/0223617 A1 | 8/2016 | Tao et al. | |

FOREIGN PATENT DOCUMENTS

| JP | 2011-220900 A | 11/2011 |
| JP | 2013-254710 A | 12/2013 |

(Continued)

OTHER PUBLICATIONS

Heeger et al., "Lithium Battery Health and Capacity Estimation Techniques Using Embedded Electronics" 2017, Sandia Report SAND2017-10722 (Year: 2017).*

(Continued)

*Primary Examiner* — Roy Y Yi
(74) *Attorney, Agent, or Firm* — Westerman, Hattori, Daniels & Adrian, LLP

(57) ABSTRACT

A life estimation apparatus includes a second calculation unit that calculates a remaining capacity, which is a capacity with which the lithium ion secondary cell is capable of being charged or which the lithium ion secondary cell is capable of discharging, based on Equation 1 having an exponent n1 of 0.9 to 1.1 and Equation 2 having an exponent n2 of 0.4 to 0.6. The second calculation unit calculates the remaining capacity using Equation 1 if the amount of change of open circuit voltage, the amount of change of a voltage rise width, or the amount of change of a voltage rise rate has a positive value and calculates the remaining capacity using Equation 2 if the amount of change of the open circuit voltage, the amount of change of the voltage rise width, or the amount of change of the voltage rise rate has a negative value.

5 Claims, 4 Drawing Sheets

(51) Int. Cl.
- *G01R 31/3842* (2019.01)
- *H02J 7/00* (2006.01)
- *H01M 10/44* (2006.01)
- *G01R 31/36* (2020.01)
- *H01M 10/0525* (2010.01)

(52) U.S. Cl.
CPC ....... *H01M 10/0525* (2013.01); *H01M 10/44* (2013.01); *H01M 10/48* (2013.01); *H02J 7/00* (2013.01); *H02J 7/0068* (2013.01)

(56) References Cited

FOREIGN PATENT DOCUMENTS

| | | |
|---|---|---|
| JP | 2015-59928 A | 3/2015 |
| WO | 2015/037184 A1 | 3/2015 |

OTHER PUBLICATIONS

Dvorak et al. "A Comprehensive Algorithm for Estimating Lithium-Ion Battery Parameters from Measurements," 2018, IEEE Transactions on Sustainable Energy, vol. 9. No. 2. (Year: 2018).*

Belt et al., "Calendar and PHEV cycle life aging of high-energy, lithium-ion cells containing blended spinel and layered-oxide cathodes", Journal of Power Sources, 2011, 196, pp. 10213-10221, (9 pages).

Yoshida et al., "Capacity Loss Mechanism of Space Lithium-Ion Cells and Its Life Estimation Method", Electrochemistry, 2003, 71, pp. 1018-1024, (7 pages).

International Search Report dated Feb. 28, 2017, issued in counterpart application No. PCT/JP2017/003773 (1 page).

\* cited by examiner

LIFE ESTIMATION APPARATUS FOR LITHIUM ION SECONDARY CELL

TECHNICAL FIELD

The present disclosure relates to a life estimation apparatus for a lithium ion secondary cell.

BACKGROUND ART

Some methods of estimating the remaining lives of lithium ion secondary cells, in which the lithium ion secondary cells are available, have hitherto been proposed. For example, NPL 1 discloses a method of estimating the degradation in capacity of a cell using so-called linear rule (linear degradation) in which the capacity of the cell is linearly decreased in proportion to the cumulative use period of the cell. NPL 2 discloses a method of estimating the degradation in capacity of a cell using so-called root rule (root degradation) in which the capacity of the cell is gradually decreased with the elapse of the use period of the cell. The linear degradation is considered to be caused by degradation of a positive electrode and the root degradation is considered to be caused by degradation of a negative electrode.

In order to more accurately estimate the remaining life of a cell, PTL 1 discloses a life estimation apparatus using one equation in which both the linear rule and the root rule are combined. Estimation of the remaining life of a cell using a relational expression indicated by a function including a first term and a second term is described in PTL 1. An exponential function using a value calculated by multiplying the cumulative use period of the cell by a positive first constant as a variable is used in the first term. A square root function of the cumulative use period is used in the second term.

CITATION LIST

Patent Literature

PTL 1: Japanese Published Unexamined Patent Application No. 2013-254710

Non Patent Literature

NPL 1: J. Belt et al., Journal of Power Sources 196 (2011), 10213 to 10221

NPL 2: H. Yoshida et al., Electrochemistry 71 (2003), 1018 to 1024

SUMMARY OF INVENTION

With the method in PTL 1, improvement of the estimation accuracy is expected, compared with a case in which either of the linear rule and the root rule is simply used. However, even with the method in PTL 1, a large difference still exists between estimated values and actually measured values and further improvement of the estimation accuracy is required.

The present invention provides a life estimation apparatus for a lithium ion secondary cell. The life estimation apparatus includes a first acquisition unit that acquires a cumulative number of cycles or a cumulative capacity from a time when use of the lithium ion secondary cell is started; a second acquisition unit that acquires open circuit voltage, a voltage rise width after discharge is stopped, or a voltage rise rate per certain time after discharge is stopped at a certain depth of discharge of the lithium ion secondary cell; a first calculation unit that calculates an amount of change of the open circuit voltage, an amount of change of the voltage rise width, or an amount of change of the voltage rise rate during a certain period; and a second calculation unit that calculates a remaining capacity, which is a capacity with which the lithium ion secondary cell is capable of being charged or which the lithium ion secondary cell is capable of discharging, based on Equation 1 having an exponent n1 of 0.9 to 1.1 and Equation 2 having an exponent n2 of 0.4 to 0.6. The second calculation unit calculates the remaining capacity using Equation 1 if the amount of change of the open circuit voltage, the amount of change of the voltage rise width, or the amount of change of the voltage rise rate has a positive value and calculates the remaining capacity using Equation 2 if the amount of change of the open circuit voltage, the amount of change of the voltage rise width, or the amount of change of the voltage rise rate has a negative value. Equation 1 and Equation 2 are as follows:

Remaining capacity=Capacity 1−α×(Cumulative number of cycles or Cumulative capacity)$^{n1}$    Equation 1

Remaining capacity=Capacity 2−β×(Cumulative number of cycles or Cumulative capacity)$^{n2}$    Equation 2 where $\alpha$ and $\beta$ are different constants, Capacity 1 is an initial capacity of the lithium ion secondary cell or the remaining capacity calculated according to Equation 2, and Capacity 2 is the initial capacity or the remaining capacity calculated according to Equation 1.

According to the life estimation apparatus for a lithium ion secondary cell according to the present disclosure, it is possible to more accurately estimate the life, compared with methods in related art.

DESCRIPTION OF EMBODIMENTS

Discussion has been held by the inventors and others in order to improve the accuracy of estimation of the life of a lithium ion secondary cell. Then, the inventors and others have found a new method of switching between estimation equations (Equation 1 and Equation 2 described above) based on transition of open circuit voltage of the cell. In particular, as for the lithium ion secondary cell using lithium transition metal oxide having a layered structure as a positive electrode active material, it is difficult to calculate the transition of the capacity using a simple numerical expression and it is not possible to accurately estimate the remaining life of the lithium ion secondary cell with the methods in the related art. With a life estimation apparatus of the present disclosure, little difference exists between estimated values and actually measured values as to the cell using the lithium transition metal oxide having a layered structure and it is possible to more accurately estimate the life of the cell. In addition, as a trigger to switch between the estimation equations, transition of a voltage rise width after discharge is stopped or transition of a voltage rise rate per certain time after discharge is stopped may be used, instead of the transition of the open circuit voltage.

An exemplary embodiment of a life estimation apparatus for a lithium ion secondary cell according to the present disclosure will herein be described in detail with reference to the drawings.

Figure 1:
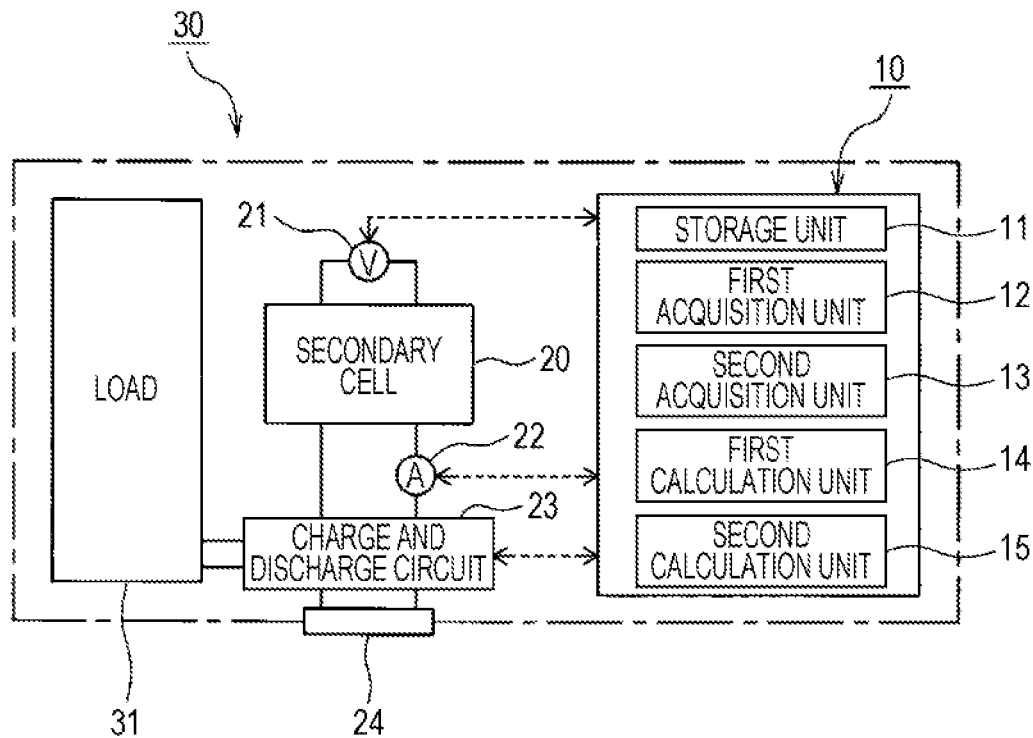
FIG. 1 is a block diagram illustrating the configuration of a life estimation apparatus for a lithium ion secondary cell, according to an exemplary embodiment, and a system in which the life estimation apparatus is installed.

FIG. 1 is a block diagram illustrating the configuration of a life estimation apparatus 10 for a lithium ion secondary cell (hereinafter referred to as a "life estimation apparatus 10") according to an exemplary embodiment and a system 30 in which the life estimation apparatus 10 is installed. As illustrated in FIG. 1, the life estimation apparatus 10 is an apparatus that includes a storage unit 11 in which Equation 1 having an exponent n1 of 0.9 to 1.1 and Equation 2 having an exponent n2 of 0.4 to 0.6 are stored and that estimates the life of a lithium ion secondary cell 20 using Equation 1 and Equation 2.

$$\text{Remaining capacity=Capacity 1}-\alpha\times(\text{Cumulative number of cycles or Cumulative capacity})^{n1} \quad \text{Equation 1}$$

$$\text{Remaining capacity=Capacity 2}-\beta\times(\text{Cumulative number of cycles or Cumulative capacity})^{n2} \quad \text{Equation 2}$$

where $\alpha$ and $\beta$ are different constants, Capacity 1 is an initial capacity of the lithium ion secondary cell 20 or the remaining capacity calculated according to Equation 2, and Capacity 2 is the initial capacity or the remaining capacity calculated according to Equation 1.

The remaining capacity calculated by the life estimation apparatus 10 is the capacity with which the lithium ion secondary cell 20 is capable of being charged or which the lithium ion secondary cell 20 is capable of discharging. In other words, the life of the lithium ion secondary cell 20 means a time period from the time when use of the cell is started to the time when the remaining capacity becomes zero. The remaining capacity is capable of being arbitrarily set depending on, for example, the application of the lithium ion secondary cell 20 and is set to, for example, 50% of the initial capacity. The remaining capacity and the initial capacity of the lithium ion secondary cell 20 mean discharge capacities calculated from an open circuit voltage curve when discharge is performed from a full charge state to a full discharge state (a depth of discharge of 100%).

The life estimation apparatus 10 is incorporated as part of the system 30, for example, with the lithium ion secondary cell 20 and is built into the system 30. The system 30 is composed of a load 31, the lithium ion secondary cell 20 that supplies power to the load 31, and the life estimation apparatus 10 that estimates the life of the lithium ion secondary cell 20. However, at least one of the life estimation apparatus 10 and the lithium ion secondary cell 20 may not be built into the system 30.

The system 30 is exemplified by, for example, a notebook computer, a tablet, a smartphone, a mobile phone, a mobile router, an automobile, or various power supply units. When the system 30 is a notebook computer, the load 31 is exemplified by, for example, a monitor, a central processing unit (CPU), or a memory. The system 30 in which the life estimation apparatus 10 is installed is not particularly limited. In the system 30, when the remaining capacity of the lithium ion secondary cell 20 becomes zero, for example, power supply from the lithium ion secondary cell 20 to the load 31 is inhibited. The remaining capacity of the lithium ion secondary cell 20 or the fact that the remaining capacity becomes zero (the cell reaches the end of the life) may be displayed on the monitor or the like.

The system 30 includes a voltmeter 21 that measures the voltage of the lithium ion secondary cell 20, an ammeter 22 that measures the current output from the cell and the current input into the cell, and a charge and discharge circuit 23. The charge and discharge circuit 23 is a circuit that includes a switching element (not illustrated) and that controls the power supplied from the lithium ion secondary cell 20 to the load 31. In addition, the charge and discharge circuit 23 controls charge of the lithium ion secondary cell 20 with an external power supply. The system 30 includes a connector 24 to which a cable connected to the external power supply is to be mounted.

The lithium ion secondary cell 20 includes an electrode body including a positive electrode, a negative electrode, and a separator, non-aqueous electrolyte, and a cell case in which the electrode body and the non-aqueous electrolyte are housed. The electrode body has, for example, a winding structure in which the positive electrode and the negative electrode are wound with the separator disposed therebetween or a layered structure in which multiple positive electrodes and multiple negative electrodes are alternately layered with separators disposed therebetween. The lithium ion secondary cell 20 may have any shape and may be, for example, a cylindrical cell, a square cell, a coin-type cell, or a laminated cell.

The number of the lithium ion secondary cells 20 is not particularly limited and one lithium ion secondary cell 20 may be provided or multiple lithium ion secondary cells 20 may be provided. The multiple cells may be connected in series or in parallel to each other to compose a module. When the multiple lithium ion secondary cells 20 are installed in the system 30, the life estimation apparatus 10 estimates the remaining life, for example, in units of modules or in units of parallel blocks.

The positive electrode includes a positive electrode collector and a positive electrode active material layer formed on the collector. For example, a lithium transition metal oxide having a layered structure is used as the positive electrode active material. The lithium transition metal oxide is compound oxide containing a metallic element, such as Co, Mn, Ni, or Al. Although the lithium transition metal oxide is not particularly limited, the lithium transition metal oxide is preferably compound oxide represented by a general expression $Li_{1+x}MO_2$ (in the expression, $-0.2<x\leq0.2$ and M includes at least one of Ni, Co, Mn, and Al).

The negative electrode includes a negative electrode collector and a negative electrode active material layer formed on the collector. The negative electrode active material is not particularly limited as long as it is capable of reversibly occluding or discharging the lithium ion. For example, metal capable of being alloyed with lithium, such as a carbon material, for example, natural graphite or artificial graphite, Si, or Sn, alloy including these metals, or compound oxide may be used as the negative electrode active material.

The life estimation apparatus 10 includes the storage unit 11 in which Equation 1 and Equation 2 are stored, as described above. In addition to Equation 1 and Equation 2 (including $\alpha$ and $\beta$), data necessary for a process of estimating the life of the cell, such as the initial capacity of the lithium ion secondary cell 20, programs for performing the process, and so on are stored in the storage unit 11. In addition, data acquired by each acquisition unit described below and so on are sequentially stored in the storage unit 11. The life estimation apparatus 10 is composed of a microcomputer including, for example, the CPU, a memory, and an input-output port.

The life estimation apparatus 10 further includes a first acquisition unit 12, a second acquisition unit 13, a first calculation unit 14, and a second calculation unit 15. The first acquisition unit 12 and the second acquisition unit 13 acquire data necessary for the process of estimating the life from the voltmeter 21, the ammeter 22, the charge and discharge circuit 23, and so on. The first calculation unit 14 calculates parameters necessary for calculation of the remaining capacity of the lithium ion secondary cell 20 by the second calculation unit 15 based on the data acquired by each acquisition unit. The second calculation unit 15 reads out Equation 1 or Equation 2 from the storage unit 11 to calculate the remaining capacity based on the data acquired by each acquisition unit, the data stored in the storage unit 11 in advance, and the parameters calculated by the first calculation unit 14, and so on.

The first acquisition unit 12 acquires the cumulative number of cycles or the cumulative capacity from the time when use of the lithium ion secondary cell 20 is started. The cumulative number of cycles from the start of use is acquired by, for example, counting the number of times of switching between charging and discharging by the charge and discharge circuit 23 or counting the number of times when the orientation of the current measured by the ammeter 22 is changed. The first acquisition unit 12 counts, for example, the number of times of the switching by the charge and discharge circuit 23, stores the counted value in the storage unit 11, and sequentially updates the data to acquire the cumulative number of cycles. The cumulative capacity from the start of use is acquired by, for example, integrating the discharge capacity calculated by multiplying the discharge time at each discharge by discharge current. The first acquisition unit 12 calculates the discharge capacity at each discharge, stores the calculated value in the storage unit 11, and sequentially updates the data to acquire the cumulative capacity.

A value calculated by dividing the cumulative capacity by the initial capacity of the lithium ion secondary cell 20 (the cumulative capacity/the initial capacity) is preferably used as the cumulative number of cycles. The cumulative capacity/the initial capacity is a value corresponding to the cumulative number of cycles at a depth of discharge of 100% at which discharge is performed from the full charge state to the full discharge state. Since the life (remaining capacity) of the lithium ion secondary cell 20 is calculated using the open circuit voltage at a depth of discharge of 100%, as described below, the cumulative number of cycles used in the calculation is preferably calculated by integrating the numbers of cycles at a depth of discharge of 100%. Use of the value of the cumulative capacity/the initial capacity as the cumulative number of cycles enables accurate estimation of the life of the cell even when charge and discharge at a depth of discharge of 100% or less is performed.

The second acquisition unit 13 acquires the open circuit voltage (hereinafter referred to as the "OCV") at a certain depth of discharge of the lithium ion secondary cell 20. The OCV of the lithium ion secondary cell 20 is measured by the voltmeter 21, for example, in a state in which the load 31 is disconnected from the external power supply. The second acquisition unit 13 acquires the value measured by the voltmeter 21 and stores the value in the storage unit 11. Each acquisition unit stores the cumulative number of cycles and the OCV in the storage unit 11 with the cumulative number of cycles being associated with the OCV.

The OCV is measured under, for example, a condition of a depth of discharge of 100%. The OCV is preferably measured at a time when 10 minutes or more elapse after discharge (a discharge stop time is set to 10 minutes) at a depth of discharge of 100%. The OCV is more preferably measured at a time when 20 minutes or more elapse after discharge and is especially preferably measured at a time when 30 minutes or more elapse after discharge.

The second acquisition unit 13 acquires the OCV, for example, at timing when the charge and discharge at a depth of discharge of 100% is performed. In an application in which the charge and discharge at a depth of discharge of 100% is constantly performed, the OCV may be acquired every cycle to perform the process of estimating the life of the cell. Since, in general, the charge and discharge at a depth of discharge of 100% is not constantly performed, the OCV is acquired, for example, once per several charges and discharges. When the system 30 is a notebook computer, the life estimation apparatus 10 may periodically output a display prompting use of a depth of discharge of 100% on the monitor to acquire the OCV every certain period.

The first calculation unit 14 calculates the amount of change of the OCV during the certain period. The amount of change of the OCV is used as a trigger to switch between the estimation equations of two kinds. The certain period may be arbitrarily set. For example, the OCV that has been previously acquired is read out from the storage unit 11 at timing when the OCV is acquired to calculate the amount of change of the OCV. In this case, the interval at which the OCVs are acquired is the certain period.

The first calculation unit 14 subtracts, for example, the OCV at the current time T2 (hereinafter referred to as "OCV (T2)") from the OCV at a time T1 when the OCV has been previously acquired (hereinafter referred to as "OCV (T1)") to calculate the amount of change of the OCV (OCV (T2)−OCV (T1)). The amount of change of the OCV is calculated as a positive value or a negative value and the calculated value is stored in the storage unit 11.

The second calculation unit 15 calculates the remaining capacity, which is the capacity with which the lithium ion secondary cell 20 is capable of being charged or which the lithium ion secondary cell 20 is capable of discharging, based on Equation 1 having the exponent n1 of 0.9 to 1.1 and Equation 2 having the exponent n2 of 0.4 to 0.6. The second calculation unit 15 selects either of the estimation equations of two kinds based on the amount of change of the OCV, calculated by the first calculation unit 14, to calculate the remaining capacity using the selected equation.

Equation 1 is an equation based on the linear rule.

$$\text{Remaining capacity} = \text{Capacity 1} - \alpha \times (\text{Cumulative number of cycles or Cumulative capacity})^{n1} \quad \text{Equation 1}$$

where α is a constant and Capacity 1 is the initial capacity of the lithium ion secondary cell 20 or the remaining capacity calculated according to Equation 2. The exponent n1 is equal to 0.9 to 1.1, as described above, and is equal to, for example, 1.0. "α×(Cumulative number of cycles or Cumulative capacity)$^{n1}$", which is the second term of Equation 1, is used to calculate a degradation capacity. Subtraction of "α×(Cumulative number of cycles or Cumulative capacity)$^{n1}$" from Capacity 1 produces the remaining capacity. α and n1 are calculated through an actual charge and discharge test using the lithium ion secondary cell 20 (a charge and discharge test at a depth of discharge of 100%) and are stored in the storage unit 11 in advance. α and n1 are varied depending on the kind of the cell (the positive electrode, the negative electrode, the non-aqueous electrolyte, or the like), the usage environment that is assumed, and so on.

Equation 2 is an equation based on the root rule.

$$\text{Remaining capacity} = \text{Capacity 2} - \beta \times (\text{Cumulative number of cycles or Cumulative capacity})^{n2} \quad \text{Equation 2}$$

where β is a constant and Capacity 2 is the initial capacity of the lithium ion secondary cell 20 or the remaining capacity calculated according to Equation 1. The exponent n2 is equal to 0.4 to 0.6, as described above, and is equal to, for example, 0.5. "β×(Cumulative number of cycles or Cumulative capacity)$^{n2}$", which is the second term of Equation 2, is used to calculate the degradation capacity. Subtraction of "β×(Cumulative number of cycles or Cumulative capacity)$^{n2}$" from Capacity 2 produces the remaining capacity. β and n2 are calculated through an actual charge and discharge test using the lithium ion secondary cell 20 and are stored in the storage unit 11 in advance. β and n2 are varied depending on the kind of the cell, the usage environment that is assumed, and so on.

The second calculation unit 15 uses the amount of change of the OCV as the trigger to select Equation 1 or Equation 2, as described above. Specifically, the second calculation unit 15 calculates the remaining capacity using Equation 1 when the amount of change of the OCV has a positive value and calculates the remaining capacity using Equation 2 when the amount of change of the OCV has a negative value. In other words, the second calculation unit 15 reads out an appropriate equation from the storage unit 11 based on the amount of change of the OCV and calculates the remaining capacity selectively using the equations of two kinds.

Figure 2:
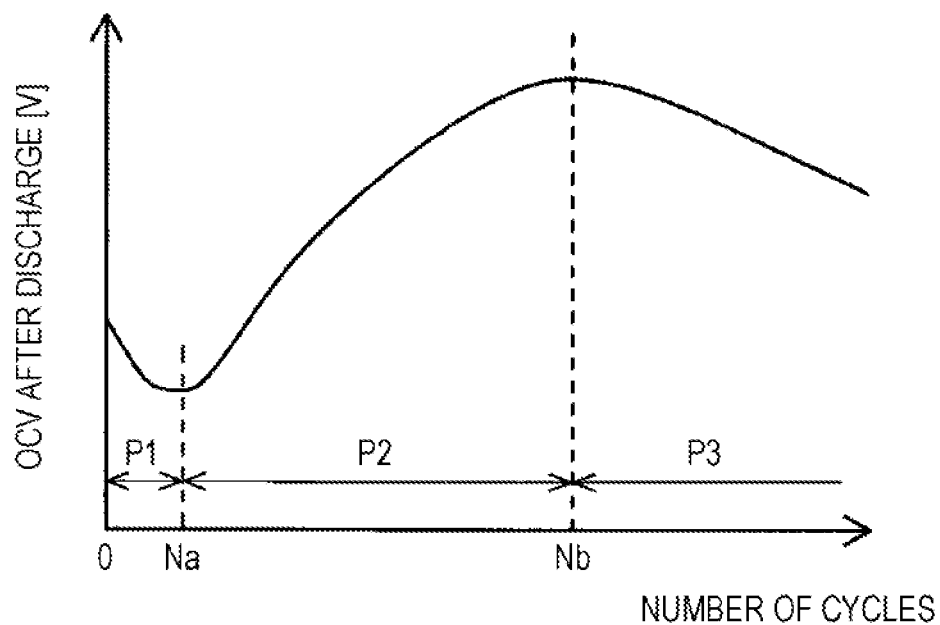
FIG. 2 is a graph illustrating the relationship between open circuit voltage (OCV) and the number of cycles of the lithium ion secondary cell.

FIG. 2 is a graph illustrating the relationship between the OCV and the number of cycles of the lithium ion secondary cell 20. In the example illustrated in FIG. 2, the OCV is gradually decreased at the initial stage after the start of use of the cell, is gradually increased, and then is decreased again with the increasing number of cycles. The lithium ion secondary cell 20 of the present embodiment has characteristics in which the amount of change of the OCV is varied from negative values to positive values and, then, is varied from positive values to negative values. The transition of the OCV is varied depending on the kind of the cell and the OCV may be gradually increased from the initial stage after the start of use and then may be decreased.

In the case of the lithium ion secondary cell 20 having the transition of the OCV illustrated in FIG. 2, the second calculation unit 15 uses Equation 2-1 and Equation 2-2 as Equation 2 and sequentially switches between Equation 2-1, Equation 1, and Equation 2-2 to calculate the remaining capacity.

Equation 2-1 and Equation 2-2 are as follows:

$$\text{Remaining capacity} = \text{Initial capacity} - \beta 1 \times (\text{Cumulative number of cycles or Cumulative capacity})^{n2} \quad \text{Equation 2-1}$$

$$\text{Remaining capacity} = \text{Capacity 2} - \beta 2 \times (\text{Cumulative number of cycles or Cumulative capacity})^{n2} \quad \text{Equation 2-2}$$

where β1 and β2 are different constants and Capacity 2 is the remaining capacity calculated according to Equation 1. The exponent n2 is equal to 0.4 to 0.6 and is preferably equal to 0.5. β1, β2, and n2 are calculated through an actual charge and discharge test using the lithium ion secondary cell 20 and are stored in the storage unit 11 in advance. Here, α is set to, for example, 0.005 to 1, β is set to, for example, −10 to 30, β1 is set to, for example, −10 to 30, and β2 is set to, for example 0 to 30.

In the example illustrated in FIG. 2, the amount of change of the OCV has negative values from the start of use of the lithium ion secondary cell 20 to a number of cycles Na (a period P1), has positive values from the number of cycles Na to a number of cycles Nb (a period P2), and has negative values at numbers of cycles exceeding the number of cycles Nb (a period P3). Accordingly, Equation 2-1 is used during the period P1, Equation 1 is used in the period P2, and Equation 2-2 is used during the period P3. In this case, the remaining capacity calculated according to Equation 2-1 is used for "Capacity 1", which is the first term of Equation 1.

Figure 3:
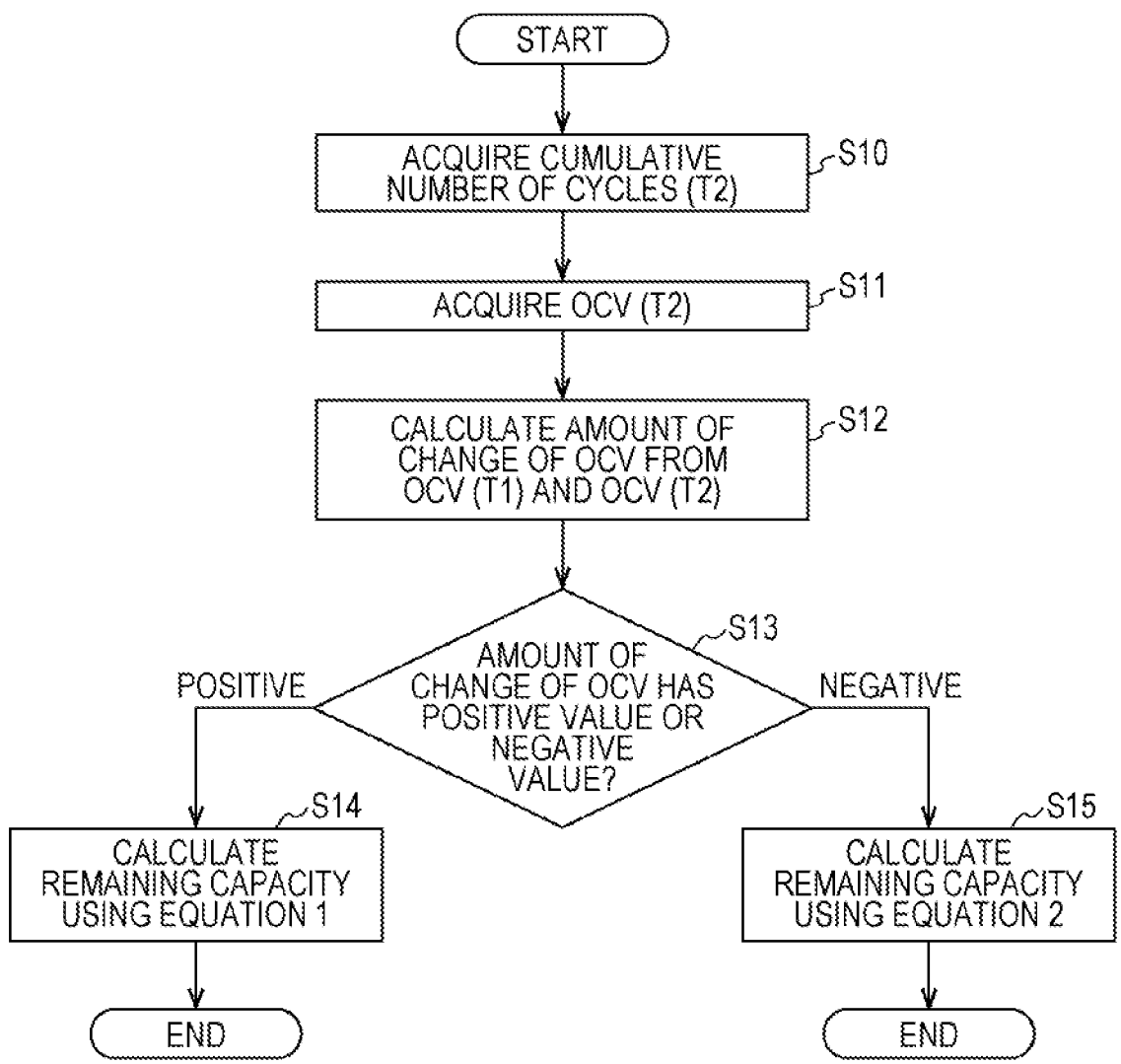
FIG. 3 is a flowchart illustrating an estimation process by the life estimation apparatus for the lithium ion secondary cell according to the exemplary embodiment.

FIG. 3 is a flowchart illustrating an exemplary process of estimating the life of the lithium ion secondary cell 20 by the life estimation apparatus 10. The process of estimating the life at the current time T2 is illustrated in FIG. 3. It is assumed that the lithium ion secondary cell 20 exposes the transition of the OCV illustrated in FIG. 2.

As illustrated in FIG. 3, first, the cumulative number of cycles (T2) of the lithium ion secondary cell 20 at the current time T2 is acquired (S10). This step is performed by the function of the first acquisition unit 12. A value calculated by dividing the cumulative capacity (T2) by the initial capacity is preferably used as the cumulative number of cycles (T2), as described above. The first acquisition unit 12 reads out the cumulative capacity (T2) and the initial capacity, for example, from the storage unit 11 to calculate the cumulative capacity (T2)/the initial capacity. The cumulative capacity (T2) may be directly used in the estimation process.

Next, the OCV (T2) of the lithium ion secondary cell 20 is acquired (S11). This step is performed by the function of the second acquisition unit 13. A value measured at a time when 10 minutes or more elapse after discharge at a depth of discharge of 100% is preferably used as the OCV (T2), as described above. The second acquisition unit 13 acquires the measured value (OCV (T2)), for example, from the voltmeter 21 and stores the acquired value in the storage unit 11.

Next, the amount of change of the OCV is calculated from the OCV (T2) and the OCV (T1) (S12). This step is performed by the function of the first calculation unit 14. The OVC (T1) has a value that has been previously acquired at the time T1. The first calculation unit 14 reads out the OCV (T2) and the OCV (T1), for example, from the storage unit 11, calculates the amount of change of the OCV (OCV (T2)−OCV (T1)), and stores the calculated amount of change of the OCV in the storage unit 11. The amount of change of the OCV used in this estimation process is the amount of change during a period from the time T1 when the OCV has been previously acquired to the current time T2 (the time when the OCV is next acquired).

Then, it is determined whether the amount of change of the OCV calculated in S12 has a positive value or a negative value (S13). This step and Steps S14 and S15 are performed by the function of the second calculation unit 15. The second calculation unit 15 reads out Equation 1 from the storage unit 11 if the amount of change of the OCV has a positive value and calculates the remaining capacity using Equation 1 (S14). The second calculation unit 15 reads out Equation 2 from the storage unit 11 if the amount of change of the OCV has a negative value and calculates the remaining capacity using Equation 2 (S15).

Since Equation 2-1 and Equation 2-2 are used as Equation 2 in the present embodiment, the remaining capacity is calculated using Equation 2-1, for example, when the amount of change of the OCV has a negative value at the initial stage of the cycle. In contrast, when the amount of change of the OCV has a positive value and then has a negative value again, the remaining capacity is calculated using Equation 2-2.

As described above, with the estimation process described above, it is possible to more accurately estimate the life of the cell, compared with the methods in the related art. Since a new method of switching the estimation equation based on the transition of the OCV is adopted in the life estimation apparatus 10, it is possible to perform the estimation of the life with high accuracy with little difference between the estimated values and the actually measured values.

Another exemplary embodiment will now be described with reference to FIG. 4 to FIG. 6.

In the other exemplary embodiment described with reference to FIG. 4 to FIG. 6, instead of the amount of change of the OCV, the amount of change of the voltage rise width ($\Delta V$) after discharge is stopped is used as the trigger to switch the estimation equation. In addition, the amount of change of the voltage rise rate (dv/dt) per certain time after discharge is stopped is used as the trigger. In both cases, Equation 1 and Equation 2 (Equation 2-1 and Equation 2-2) described above are used to calculate the remaining capacity. The configuration of the estimation apparatus is the same as that of the life estimation apparatus 10 illustrated in FIG. 1. A description of components duplicated with those in the above embodiment is omitted herein and the differences are mainly described.

When $\Delta V$ is used for the estimation of the life, the second acquisition unit 13 acquires $\Delta V$, the first calculation unit 14 calculates the amount of change of $\Delta V$, and the second calculation unit 15 selects Equation 1 or Equation 2 based on the amount of change of $\Delta V$. Similarly, when dv/dt is used for the estimation of the life, the second acquisition unit 13 acquires dv/dt, the first calculation unit 14 calculates the amount of change of dv/dt, and the second calculation unit 15 selects Equation 1 or Equation 2 based on the amount of change of dv/dt. In both case, the first acquisition unit 12 acquires the cumulative number of cycles or the cumulative capacity from the time when use of the lithium ion secondary cell 20 is started. In Equation 1 and Equation 2, $\alpha$, $\beta$, n1, and n2 are varied depending on which is used, among the OCV, $\Delta V$, and dv/dt.

Figure 4:
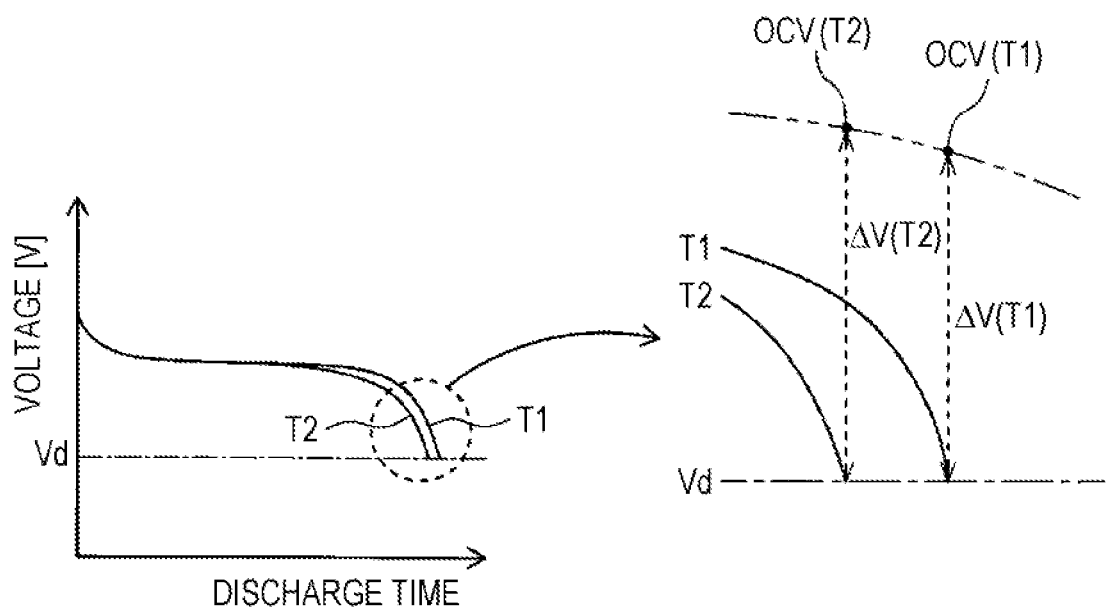
FIG. 4 is a graph illustrating discharge curves of the lithium ion secondary cell.

FIG. 4 is a graph illustrating discharge curves of the lithium ion secondary cell 20. The discharge curves when the discharge is performed until discharge termination voltage Vd is achieved are illustrated in FIG. 4 (the same discharge condition is used in the use periods T1 and T2 of the cell). As illustrated in FIG. 4, the shape of the discharge curve of the lithium ion secondary cell 20 is varied especially at a discharge end depending on the use period (the number of cycles) of the cell. In the example illustrated in FIG. 4, the discharge time until the discharge termination voltage Vd is achieved of the use period T2 is shorter than that of the use period T1.

Figure 5:
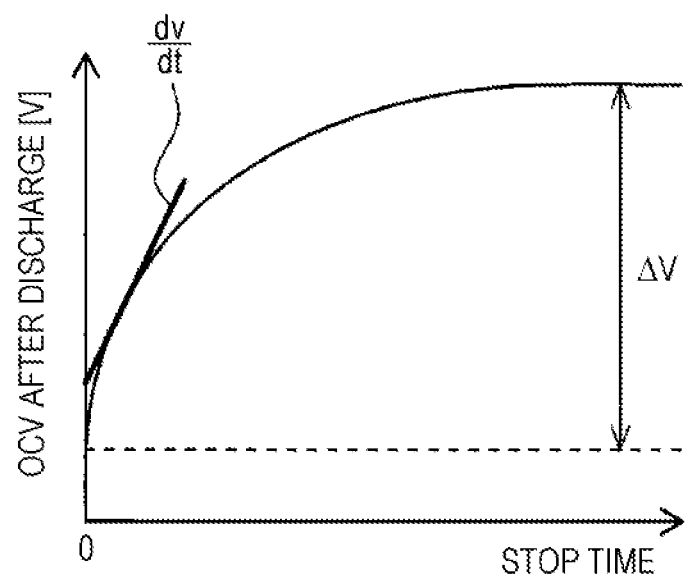
FIG. 5 is a graph illustrating the relationship between the open circuit voltage OCV and a stop time after discharge of the lithium ion secondary cell.

FIG. 5 is a graph illustrating the relationship between the OCV and the stop time after discharge of the lithium ion secondary cell 20. As illustrated in FIG. 5, in the lithium ion secondary cell 20, the OCV is increased with the stop time when the cell is disconnected from the load 31 and the external power supply after discharge and the OCV has a substantially constant value, for example, at a time when 10 minutes or more elapse. The difference between the OCV immediately after discharge is completed and the OCV, for example, at a time when 10 minutes elapse after discharge is $\Delta V$ illustrated in FIG. 4 and FIG. 5. The voltage rise rate of the OCV during a certain stop time is dv/dt illustrated in FIG. 5.

Values measured at a depth of discharge of 90% to 100% of the lithium ion secondary cell 20 are preferably used as $\Delta V$ and dv/dt. $\Delta V$ and dv/dt are measured for 10 seconds after discharge is stopped, for example, at a depth of discharge of 90% to 100%. Use of the values measured at a depth of discharge of 90% or higher increases the difference between the amount of change of the $\Delta V$ and the amount of change of dv/dt, which are calculated by the first calculation unit 14, to improve the accuracy of the estimation of the life. $\Delta V$ and dv/dt make a transition with the increasing number of cycles in the same manner as in the OCV and expose a transition, for example, illustrated in FIG. 2. Accordingly, it is possible to estimate the life of the cell using the same method as in the case in which the OCV is used also when $\Delta V$ or dv/dt is used, instead of the OCV.

Figure 6:
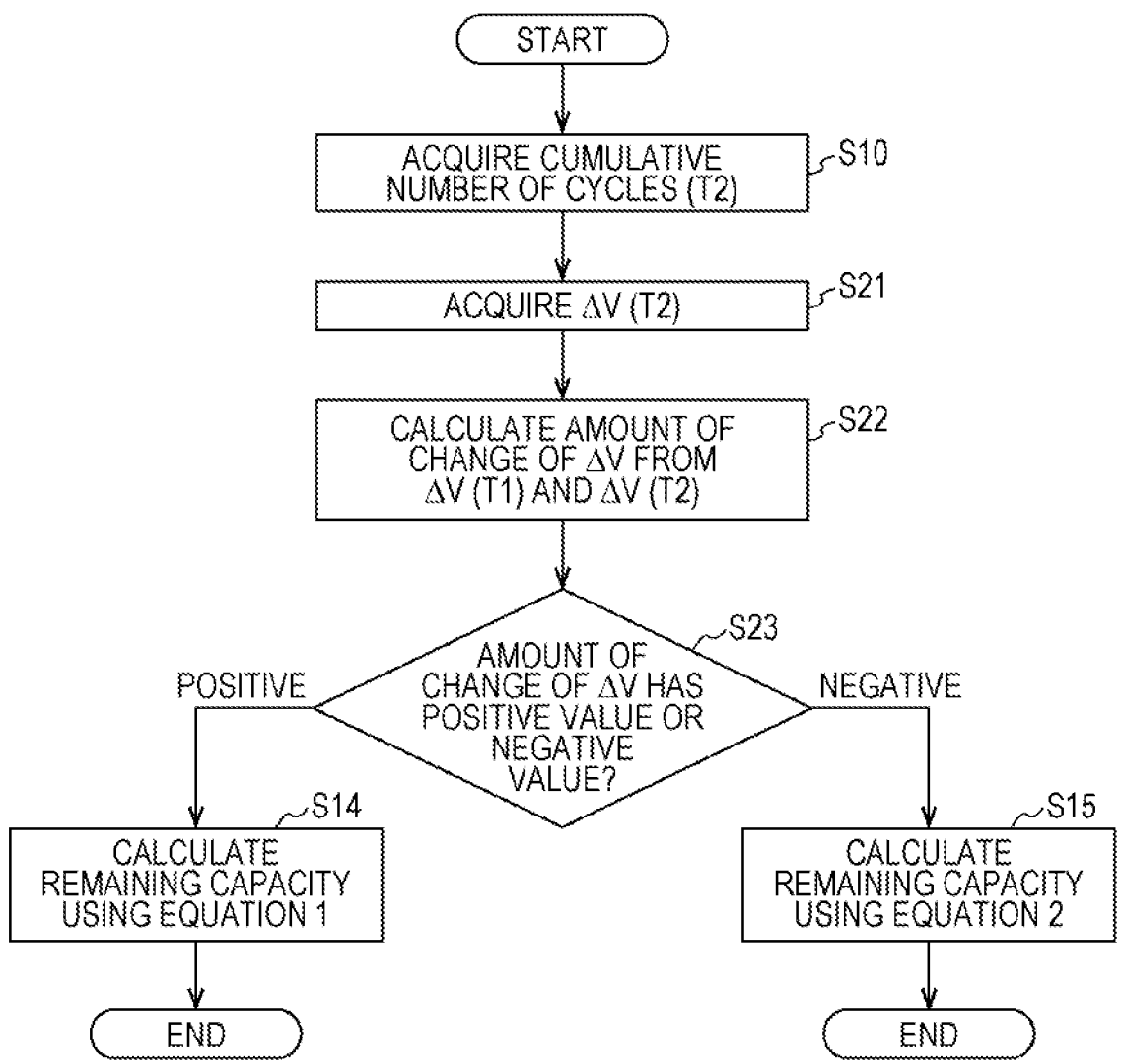
FIG. 6 is a flowchart illustrating an estimation process by the life estimation apparatus for the lithium ion secondary cell, according to another exemplary embodiment.

FIG. 6 is a flowchart illustrating an exemplary process of estimating the life using $\Delta V$. The process of estimating the life at the current time T2 is illustrated in FIG. 6. It is assumed that the lithium ion secondary cell 20 exposes the same transition of the OCV as the transition of the OCV illustrated in FIG. 2.

The estimation process illustrated in FIG. 6 is the same as the estimation process using the OCV in that, first, the cumulative number of cycles (T2) of the lithium ion secondary cell 20 at the current time T2 is acquired (S10). Next, in the estimation process, $\Delta V$ (T2) of the lithium ion secondary cell 20 is acquired (S21). This step is performed by the function of the second acquisition unit 13. $\Delta V$ (T2) is measured for 10 seconds after discharge is stopped, for example, at a depth of discharge of 90%. Next, the amount of change of $\Delta V$ is calculated from $\Delta V$ (T2) and $\Delta V$ (T1) (S22). This step is performed by the function of the first calculation unit 14. $\Delta V$ (T1) is the value that has been previously acquired at T1.

Then, it is determined whether the amount of change of $\Delta V$ calculated in S22 has a positive value or a negative value (S23). This step and Steps S14 and S15 are performed by the function of the second calculation unit 15. The second calculation unit 15 reads out Equation 1 from the storage unit 11 if the amount of change of $\Delta V$ has a positive value and calculates the remaining capacity using Equation 1 (S14). The second calculation unit 15 reads out Equation 2 from the storage unit 11 if the amount of change of $\Delta V$ has a negative value and calculates the remaining capacity using Equation 2 (S15). The estimation process using dv/dt is performed in the same manner as in the above process.

INDUSTRIAL APPLICABILITY

The present invention is available for the life estimation apparatus for a lithium ion secondary cell.

REFERENCE SIGNS LIST 10 life estimation apparatus for lithium ion secondary cell
11 storage unit
12 first acquisition unit
13 second acquisition unit
14 first calculation unit
15 second calculation unit
20 lithium ion secondary cell
21 voltmeter
22 ammeter
23 charge and discharge circuit 24 connector
30 system
31 load

The invention claimed is:

1. A life estimation apparatus that estimates a remaining life of a lithium ion secondary cell, the apparatus comprising: a first acquisition unit that acquires a cumulative number of cycles or a cumulative capacity from a time when use of the lithium ion secondary cell is started; a second acquisition unit that acquires open circuit voltage, a voltage rise width after discharge is stopped, or a voltage rise rate per certain time after discharge is stopped at a certain depth of discharge of the lithium ion secondary cell; a first calculation unit that calculates an amount of change of the open circuit voltage, an amount of change of the voltage rise width, or an amount of change of the voltage rise rate during a certain period; and a second calculation unit that calculates a remaining capacity, which is a capacity with which the lithium ion secondary cell is capable of being charged or which the lithium ion secondary cell is capable of discharging, based on Equation 1 having an exponent n1 of 0.9 to 1.1 and Equation 2 having an exponent n2 of 0.4 to 0.6, wherein the second calculation unit calculates the remaining capacity using Equation 1 if the amount of change of the open circuit voltage, the amount of change of the voltage rise width, or the amount of change of the voltage rise rate has a positive value and calculates the remaining capacity using Equation 2 if the amount of change of the open circuit voltage, the amount of change of the voltage rise width, or the amount of change of the voltage rise rate has a negative value:

$$\text{Remaining capacity} = \text{Capacity 1} - \alpha \times (\text{Cumulative number of cycles or Cumulative capacity})^{n1} \quad \text{Equation 1}$$

$$\text{Remaining capacity} = \text{Capacity 2} - \beta \times (\text{Cumulative number of cycles or Cumulative capacity})^{n2} \quad \text{Equation 2}$$

where $\alpha$ and $\beta$ are different constants, Capacity 1 is an initial capacity of the lithium ion secondary cell or the remaining capacity calculated according to Equation 2, and Capacity 2 is the initial capacity or the remaining capacity calculated according to Equation 1.

2. The life estimation apparatus according to claim 1, wherein the lithium ion secondary cell has characteristics in which the amount of change of the open circuit voltage, the amount of change of the voltage rise width, or the amount of change of the voltage rise rate is varied from negative values to positive values and, then, is varied from positive values to negative values, and wherein the second calculation unit uses Equation 2-1 and Equation 2-2 as Equation 2 and sequentially switches between Equation 2-1, Equation 1, and Equation 2-2 to calculate the remaining capacity:

$$\text{Remaining capacity} = \text{Initial capacity} - \beta 1 \times (\text{Cumulative number of cycles or Cumulative capacity})^{n2} \quad \text{Equation 2-1}$$

$$\text{Remaining capacity} = \text{Capacity 2} - \beta 2 \times (\text{Cumulative number of cycles or Cumulative capacity})^{n2} \quad \text{Equation 2-2}$$

where $\beta 1$ and $\beta 2$ are different constants and Capacity 2 is the remaining capacity calculated according to Equation 1.

3. The life estimation apparatus according to claim 1, wherein a value calculated by dividing the cumulative capacity by the initial capacity is used as the cumulative number of cycles.

4. The life estimation apparatus according to claim 1, wherein a value measured at a time when 10 minutes or more elapse after discharge at a depth of discharge of 100% is used as the open circuit voltage.

5. The life estimation apparatus according to claim 1, wherein values measured at a depth of discharge of 90% to 100% are used as the voltage rise width and the voltage rise rate.

* * * * *